US012675129B2

(12) United States Patent
Xiao

(10) Patent No.: US 12,675,129 B2
(45) Date of Patent: Jul. 7, 2026

(54) CLOCK CONTROL DEVICE AND CLOCK CONTROL METHOD FOR SERIAL PERIPHERAL INTERFACE

(71) Applicant: GIGADEVICE SEMICONDUCTOR INC., Beijing (CN)

(72) Inventor: Anbing Xiao, Beijing (CN)

(73) Assignee: GIGADEVICE SEMICONDUCTOR INC., Beijing (CN)

( * ) Notice: Subject to any disclaimer, the term of this patent is extended or adjusted under 35 U.S.C. 154(b) by 41 days.

(21) Appl. No.: 18/964,431

(22) Filed: Nov. 30, 2024

(65) Prior Publication Data

US 2025/0199564 A1    Jun. 19, 2025

(30) Foreign Application Priority Data

Dec. 19, 2023    (CN) .......................... 202311754904.9

(51) Int. Cl.
*G06F 1/08* (2006.01)
*G06F 1/12* (2006.01)
*H03K 5/01* (2006.01)
*H03K 5/00* (2006.01)

(52) U.S. Cl.
CPC .................. *G06F 1/08* (2013.01); *G06F 1/12* (2013.01); *H03K 5/01* (2013.01); *H03K 2005/00078* (2013.01); *H03K 2005/00286* (2013.01)

(58) Field of Classification Search
CPC .... G06F 1/08; G06F 1/12; H03K 5/01; H03K 2005/00078; H03K 2005/00286

USPC .......................................................... 327/291
See application file for complete search history.

(56) References Cited

U.S. PATENT DOCUMENTS

| | | | | |
|---|---|---|---|---|
| 2002/0021586 | A1* | 2/2002 | Song ......................... | G11C 7/22 |
| | | | | 365/189.02 |
| 2002/0170003 | A1* | 11/2002 | Hirabayashi ..... | G11C 29/12015 |
| | | | | 714/42 |
| 2014/0173324 | A1* | 6/2014 | Dobbs ........................ | G06F 1/04 |
| | | | | 713/501 |
| 2025/0199564 | A1* | 6/2025 | Xiao ......................... | G06F 1/08 |

FOREIGN PATENT DOCUMENTS

WO          2020180393 A          9/2020

OTHER PUBLICATIONS

Extended European search report issued in European Application No. 24213947.5, dated May 20, 2025.

* cited by examiner

*Primary Examiner* — William Hernandez
(74) *Attorney, Agent, or Firm* — PV IP PC; Wei Te Chung

(57) ABSTRACT

A clock control device for a serial peripheral interface is disposed in a control device. The clock control device includes: a local delay module configured to delay a local clock signal to obtain a first delayed local clock signal; a clock selector configured to select one of the first delayed local clock signal and an external clock signal as a basic clock signal; and a first delay module configured to phase-delay the basic clock signal to obtain a delayed basic clock signal that can be used by the control device as a reception operating clock for sampling an external data signal transmitted by a storage device.

20 Claims, 9 Drawing Sheets

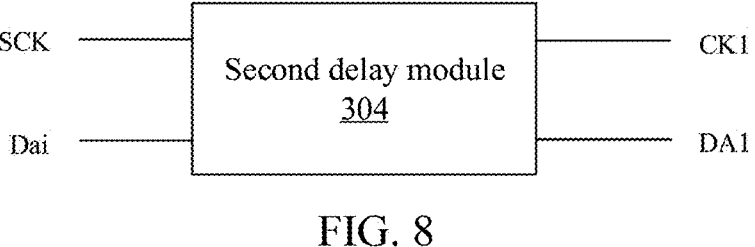

SCK ——————— | Second delay module 304 | ——————— CK1

Dai ——————— | | ——————— DA1

FIG. 8

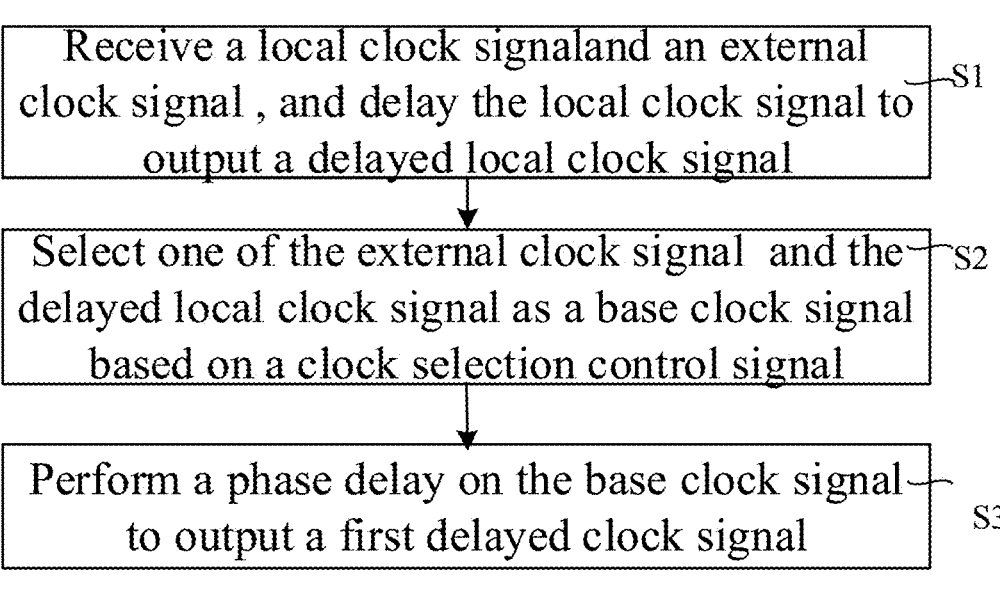

Receive a local clock signaland an external clock signal , and delay the local clock signal to output a delayed local clock signal  —S1

Select one of the external clock signal  and the delayed local clock signal as a base clock signal based on a clock selection control signal  —S2

Perform a phase delay on the base clock signal to output a first delayed clock signal  — S3

FIG. 9

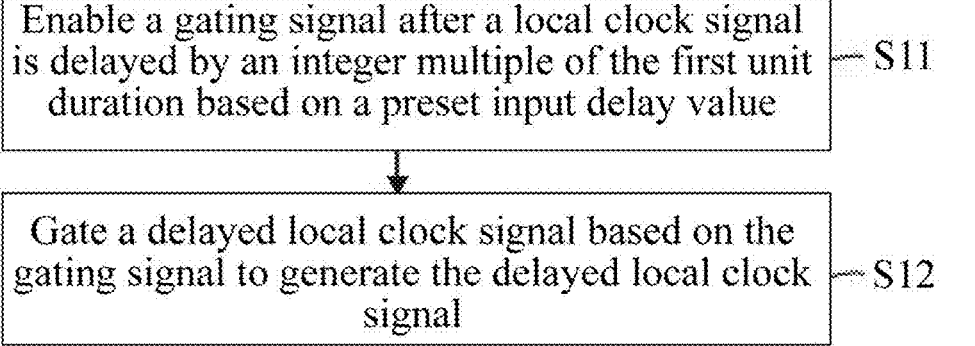

Enable a gating signal after a local clock signal is delayed by an integer multiple of the first unit duration based on a preset input delay value  — S11

Gate a delayed local clock signal based on the gating signal to generate the delayed local clock signal  — S12

FIG. 10

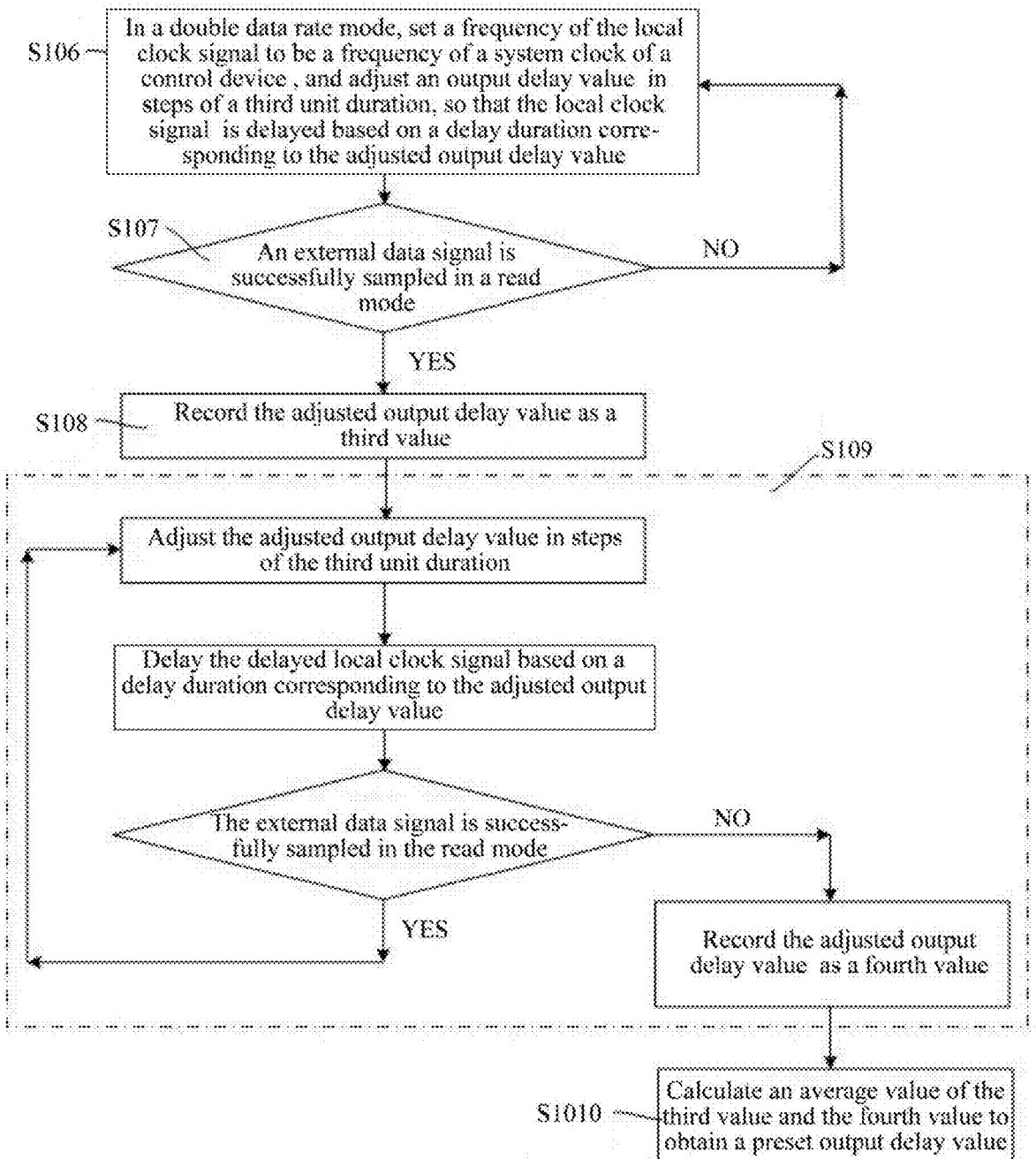

S106 — In a double data rate mode, set a frequency of the local clock signal to be a frequency of a system clock of a control device , and adjust an output delay value in steps of a third unit duration, so that the local clock signal is delayed based on a delay duration corresponding to the adjusted output delay value S107 — An external data signal is successfully sampled in a read mode    NO

YES

S108 — Record the adjusted output delay value as a third value

S109

Adjust the adjusted output delay value in steps of the third unit duration

Delay the delayed local clock signal based on a delay duration corresponding to the adjusted output delay value The external data signal is successfully sampled in the read mode    NO

YES

Record the adjusted output delay value as a fourth value

S1010 — Calculate an average value of the third value and the fourth value to obtain a preset output delay value

FIG. 12

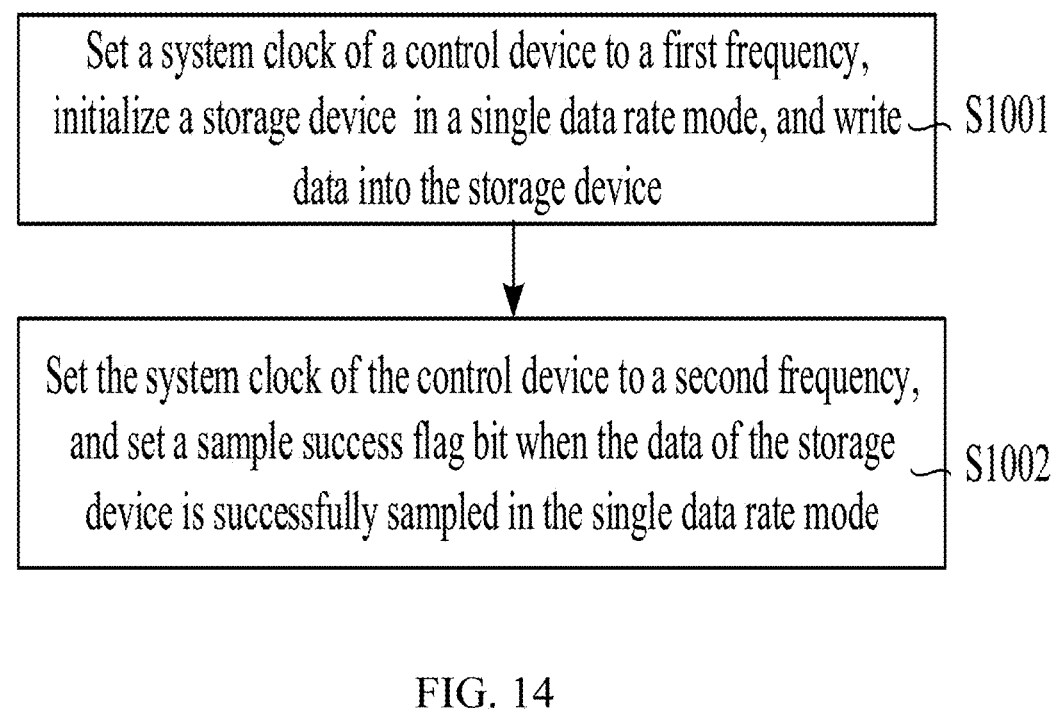

Set a system clock of a control device to a first frequency, initialize a storage device in a single data rate mode, and write data into the storage device —— S1001

Set the system clock of the control device to a second frequency, and set a sample success flag bit when the data of the storage device is successfully sampled in the single data rate mode —— S1002

FIG. 14

CLOCK CONTROL DEVICE AND CLOCK CONTROL METHOD FOR SERIAL PERIPHERAL INTERFACE

CROSS-REFERENCE TO RELATED APPLICATION

This application claims the priority to Chinese Patent Application No. 202311754904.9, filed on Dec. 19, 2023, the disclosure of which is incorporated herein by reference in its entirety.

FIELD

The present disclosure relates to serial peripheral interface technologies, and more particularly, to a clock control device and a clock control method for a serial peripheral interface.

BACKGROUND

In implementing communication between a master device and a slave device through a serial peripheral interface (SPI), the master device transmits a chip select signal via a chip select signal port to select a counterpart slave device for communication, transmits a clock signal via a clock signal port to synchronize the communication between the master device and the slave device, and implements data transmission between the master device and the slave device via a signal input/output port. An SPI master device is generally connected to a storage medium, such as an SPI flash memory and an SPI pseudo-static random access memory (PSRAM) having a single, dual, four, or eight data lines, as a slave device.

In general, the slave device drives data output based on a clock signal output by the master device, and the master device also shares a clock signal with the slave device when receiving data output by the slave device. Thus, there is a large delay between the clock signal output by the master device and a data signal received by the master device.

Specifically, the clock signal output by the master device is transmitted to the slave device through a circuit transmission path between the master device and the slave device after passing through an output path of the master device. When the slave device applies a received clock signal, there is also a corresponding transmission path inside the slave device, so that the slave device can drive the data output based on the clock signal output by the master device. When the master device receives the data output from the slave device, the data output by the slave device also needs to be transmitted to the master device through the circuit transmission path between the master device and the slave device, and then is used by the master device after passing through an input path of the master device. When the clock signal passes through the output path of the master device, the circuit transmission path between the master device and the slave device, and the internal transmission path of the slave device, there are delays, so that there is a delay in the data output by the slave device based on the clock signal. Also, there is a delay in the data signal output by the slave device when passing through the circuit transmission path between the master device and the slave device and the input path of the master device. Thus, a delay difference between the data signal received by the master device and the clock signal output by the master device is further increased. If the master device still uses the same clock signal as the slave device to acquire the data signal output from the slave device, it is necessary to reduce a data transmission frequency to a very low level so that the master device can acquire correct data. Therefore, in a case where communication between the master device and the slave device is implemented through a serial peripheral interface in a double data rate (DDR) mode, it is difficult for the SPI interface of the master device to transmit signals at a rate exceeding 100 MHz, and a high-rate transmission requirement cannot be satisfied.

SUMMARY

According to one or more embodiments of the present disclosure, a clock control device for a serial peripheral interface is disposed in a control device communicable with a storage device through the serial peripheral interface. The clock control device includes: a local delay module configured to receive a local clock signal and an external clock signal, and delay the local clock signal to output a first delayed local clock signal; a clock selector configured to select one of the external clock signal and the first delayed local clock signal as a basic clock signal based on a clock selection control signal; and a first delay module configured to phase-delay the basic clock signal to output a delayed basic clock signal. The delayed basic clock signal is used by the control device as a reception operating clock for sampling an external data signal transmitted by the storage device.

According to one or more embodiments of the present disclosure, a clock control method for a serial peripheral interface includes: receiving a local clock signal and an external clock signal, and delaying the local clock signal to output a first delayed local clock signal; selecting one of the external clock signal and the first delayed local clock signal as a basic clock signal based on a clock selection control signal; and phase-delaying the basic clock signal to output a delayed basic clock signal. The delayed basic clock signal is used by a control device as a reception operating clock for sampling an external data signal transmitted by a storage device.

BRIEF DESCRIPTION OF THE DRAWINGS

FIG. 8 is a schematic block diagram of a second delay module according to one or more embodiments of the present disclosure.

FIG. 9 is a flowchart of a clock control method for a serial peripheral interface according to one or more embodiments of the present disclosure.

FIG. 10 is a flowchart of a process of generating a delayed local clock signal according to one or more embodiments of the present disclosure.

FIG. 12 is a flowchart of a process of obtaining a preset output delay value according to one or more embodiments of the present disclosure.

FIG. 14 is a flowchart of a process of setting a sample success flag bit according to one or more embodiments of the present disclosure.

DETAILED DESCRIPTION

Some embodiments of the present disclosure will be described in detail below with reference to the accompanying drawings. The embodiments are described for illustrative purposes only and are not intended to limit the present disclosure. In the present disclosure, if not stated to the contrary, positional terms used such as "up" and "down" usually refer to "up" and "down" in actual uses or working states of a device, specifically a surface direction in the accompanying drains. And positional terms used such as "in" and "out" refer to an outline of the device.

Figure 1A:
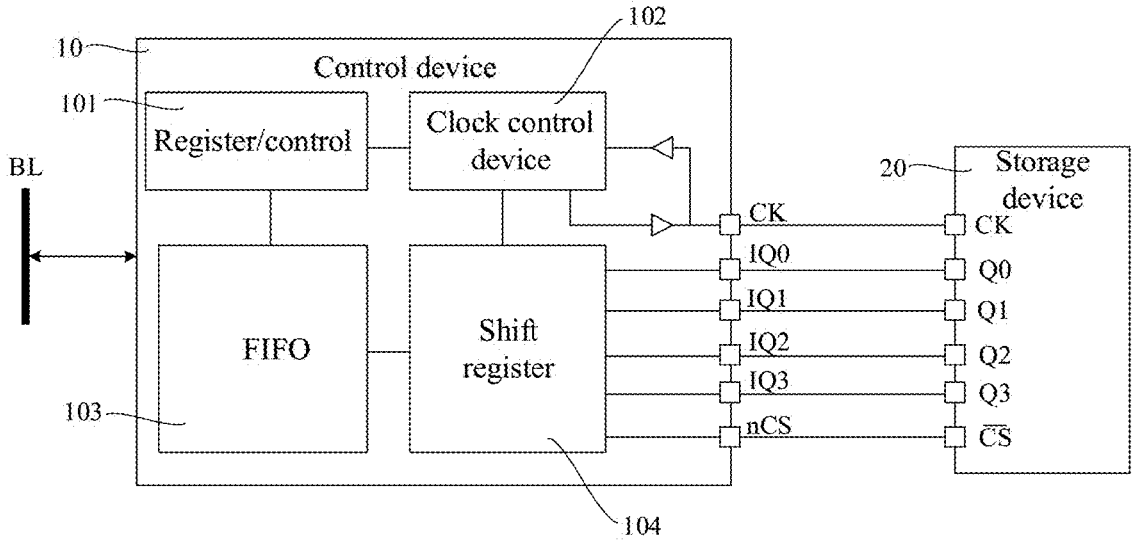
FIGS. 1A~1B schematically illustrate connection between a control device and a storage device according to one or more embodiments of the present disclosure.
Figure 1B:
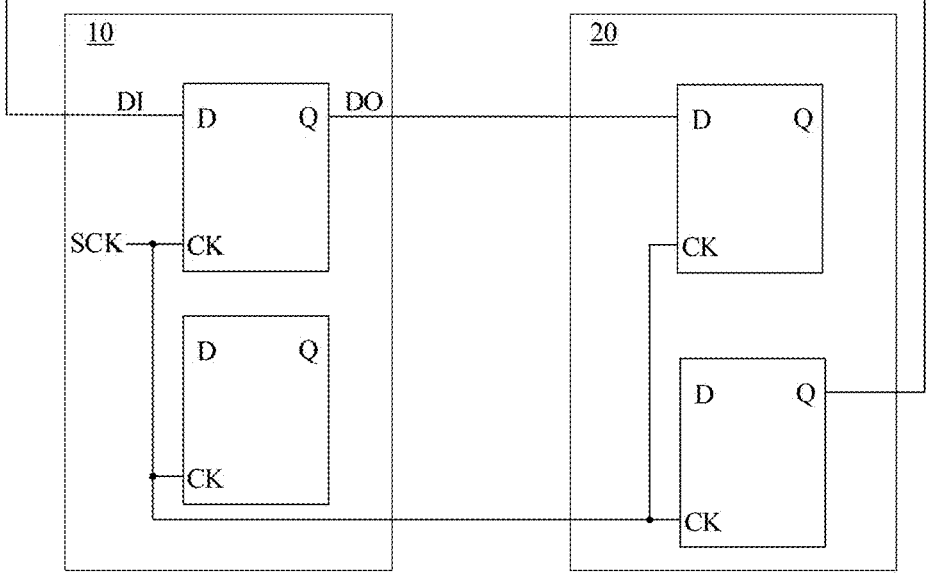

Specifically, FIGS. 1A~1B schematically illustrate connection between a control device and a storage device according to one or more embodiments of the present disclosure. A control device 10 includes a register 101, a clock control device 102, a data buffer (for example, a First Input First Output (FIFO) data buffer) 103, and a shift register 104. A bus BL is an internal bus (for example, an Advanced extensible Interface (AXI) bus or an Advanced High-performance Bus (AHB)) for communication between the control device 10 and other modules. In one or more embodiments, the control device 10 is a memory controller in a microcontroller. In other one or more embodiments, the control device 10 may further include the other modules coupled by the bus BL, in other words, the control device 10 is a microcontroller itself. The control device 10 transmits a chip select signal to a corresponding storage device 20 through a chip select signal port nCS, transmits a clock signal to the storage device 20 through a clock signal port CK, and communicates with the storage device 20 through a signal input/output port IO0~IO3. The control device 10 may serve as a master device, and the storage device 20 may serve as a slave device.

As shown in FIG. 1B, in one or more embodiments, the control device 10 outputs a local clock signal SCK and data DO to the storage device 20, the storage device 20 drives data output using the local clock signal SCK output by the control device 10, and the control device 10 uses the local clock signal SCK to receive data (i.e., DI) output by the storage device 20.

Alternatively, as previously described, the control device 10 may be a microcontrol unit, a memory controller, or the like, and the storage device 20 may be a flash memory, a PSRAM, or the like.

Figure 2:
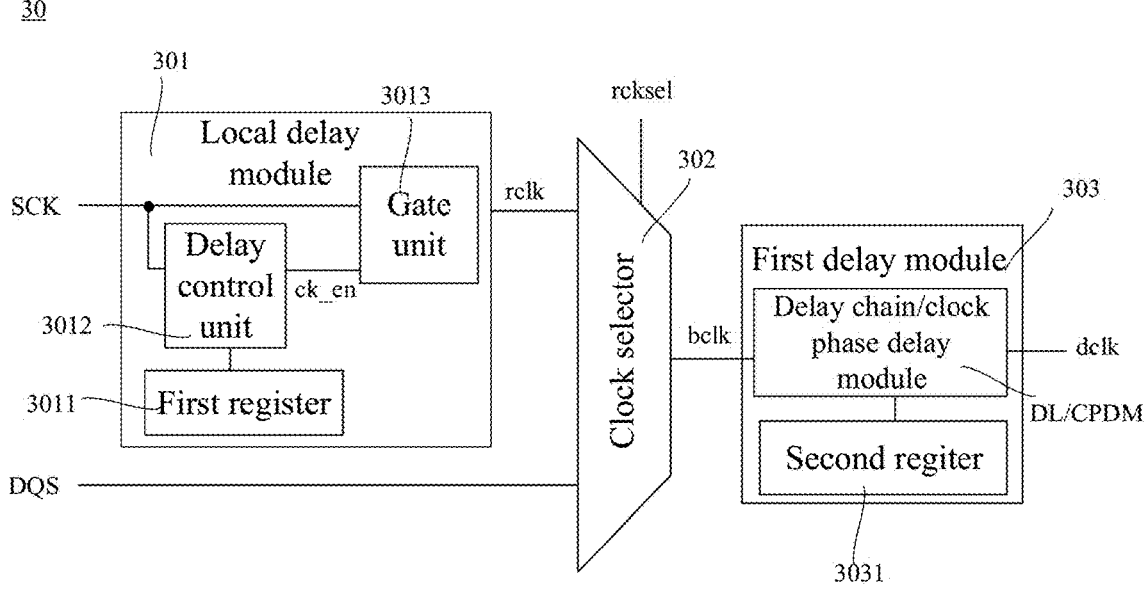
FIG. 2 is a schematic block diagram of a clock control device for a serial peripheral interface according to one or more embodiments of the present disclosure.

FIG. 2 is a schematic block diagram of a clock control device for a serial peripheral interface according to one or more embodiments of the present disclosure. A clock control device 102 of a serial peripheral interface according to one or more embodiments of the present disclosure is provided in the control device 10. The control device 10 communicates with the storage device 20 through a serial peripheral interface.

The clock control device 102 of the serial peripheral interface includes a local delay module 301, a clock selector 302, and a first delay module 303.

The local delay module 301 is configured to receive a local clock signal SCK of the control device 10 and perform delay to output a delayed local clock signal rclk.

The clock selector 302 is configured to receive the delayed local clock signal rclk and an external clock signal DQS, and select one of the clock signals to output as a basic clock signal bclk.

The first delay module 303 is configured to phase-delay the basic clock signal bclk to output a first delayed clock signal dclk which is used by the control device 10 as a reception operating clock to sample an external data signal transmitted by the storage device 20.

In the clock control device 102 according to one or more embodiments of the present disclosure, a local delay module 301 is provided to delay the local clock signal SCK, that is, to delay a sampling start time corresponding to the local clock signal SCK. The delay caused when the local clock signal SCK passes through an output path of the control device 10, a circuit transmission path between the control device 10 and the storage device 20, and an internal transmission path of the storage device 20 is compensated, so that the delay caused when the storage device 20 drives an external data signal output based on the local clock signal SCK is compensated. The sampling start time is a time when the control device 10 starts to sample the external data signal inputted.

By configuring the first delay module 303 to phase-delay the basic clock signal bclk, that is, to delay a sampling start time corresponding to the basic clock signal bclk, so that a sampling start time corresponding to the first delayed clock signal dclk lags behind the sampling start time corresponding to the basic clock signal bclk. When the control device 10 samples the external data signal by using the first delayed clock signal dclk as the reception operating clock, the delay difference between the reception operating clock and the external data signal can be reduced, so that the control device 10 can acquire correct data based on the first delayed clock signal dclk without further acquiring data by reducing a data transmission frequency. This is conducive to increase data transmission rate between the control device 10 and the storage device 20, and satisfy a high-rate transmission requirement.

By configuring the clock selector 302, one of the delayed local clock signal rclk and the external clock signal DQS is selected as the basic clock signal bclk, so that the clock control device 102 is compatible with a design in which the storage device 20 supports the external clock signal DQS, or a design in which the storage device 20 does not support the external clock signal DQS.

Alternatively, the external clock signal DQS is from the storage device 20 and is synchronized with the external data signal.

That is, in the design in which the storage device 20 supports the external clock signal DQS, the storage device 20 controls the external data signal and the external clock signal DQS to be simultaneously output, the control device 10 receives the external data signal and the external clock signal DQS as a receiving side, the clock selector 302 in the clock control device 102 may select one of the external clock signal DQS and the delayed local clock signal rclk as the basic clock signal bclk to output to the first delay module 303, and then the first delay module 303 performs a phase delay on the basic clock signal bclk to obtain the first delayed clock signal dclk. Thus, when the clock selector 302 selects the external clock signal DQS as the basic clock signal bclk, the control device 10 may sample the external data signal based on the first delayed clock signal dclk generated based on the external clock signal DQS. Accordingly, when the clock selector 302 selects the delayed local clock signal rclk as the basic clock signal bclk, the control device 10 may sample the external data signal based on the first delayed clock signal dclk generated based on the local clock signal SCK.

In a design in which the storage device 20 does not support the external clock signal DQS, the storage device 20 outputs the external data signal and does not output the external clock signal DQS. Thus, the control device 10 receives only the external data signal as the receiving side, the clock selector 302 outputs the delayed local clock signal rclk as the basic clock signal bclk to the first delay module 303, and then the first delay module 303 performs a phase delay on the basic clock signal bclk to obtain the first delayed clock signal dclk. Thus, the control device 10 may sample the external data signal based on the first delayed clock signal dclk generated based on the local clock signal SCK.

In a design in which the storage device 20 supports the external clock signal DQS, the storage device 20 controls the external data signal and the external clock signal DQS to be simultaneously output, so that there is a same delay in both the external clock signal DQS and the external data signal on the circuit transmission path between the storage device 20 and the control device 10. However, since the output of the external data signal is driven by the local clock signal SCK, the delay in the local clock signal SCK may cause the delay in the external data signal, and in turn, the accuracy of the data sampling may be affected when the control device 10 directly applies the external clock signal DQS to sample the external data signal. Therefore, the clock control device 102 according to one or more embodiments of the present disclosure is provided with the clock selector 302 and the first delay module 303. When selecting the local clock signal SCK and the external clock signal DQS, a phase delay may be performed on the delayed local clock signal rclk or the external clock signal DQS by the first delay module 303 to improve the accuracy of data sampling.

Alternatively, in one or more embodiments, the local delay module 301 is configured to delay the local clock signal SCK by an integer multiple of a first unit of time to achieve coarse adjustment of the local clock signal SCK, thereby increasing an adjustment speed of the local clock signal SCK.

Alternatively, in one or more embodiments, the first unit of time is equal to 0.5 periods of the local clock signal SCK so that a jump edge of the delayed local clock signal rclk corresponds to a jump edge of the local clock signal SCK. The jump edge includes a rising edge and a falling edge.

Referring still to FIG. 2, the local delay module 301 includes a first register 3011, a delay control unit 3012, and a gate unit 3013.

The first register 3011 is configured to delay the local clock signal SCK so that the delay of the local clock signal SCK is equal to an integer multiple of the first unit of time.

The delay control unit 3012 is configured to control to enable a gate signal ck_en after the delay of the local clock signal SCK based on a configuration of the first register 3011.

The gate unit 3013 is configured to gate the local clock signal SCK based on the gate signal ck_en to generate the delayed local clock signal rclk.

By making the gate control unit 3013 to be controlled by the gate signal ck_en, when the storage device 20 outputs data accordingly, the local clock signal SCK is controlled to be output to the clock selector 302, so that the delayed local clock signal rclk is generated after a coarse adjustment of the local clock signal SCK in steps of the first unit of time (for example, 0.5 periods of the local clock signal SCK).

Figure 3:
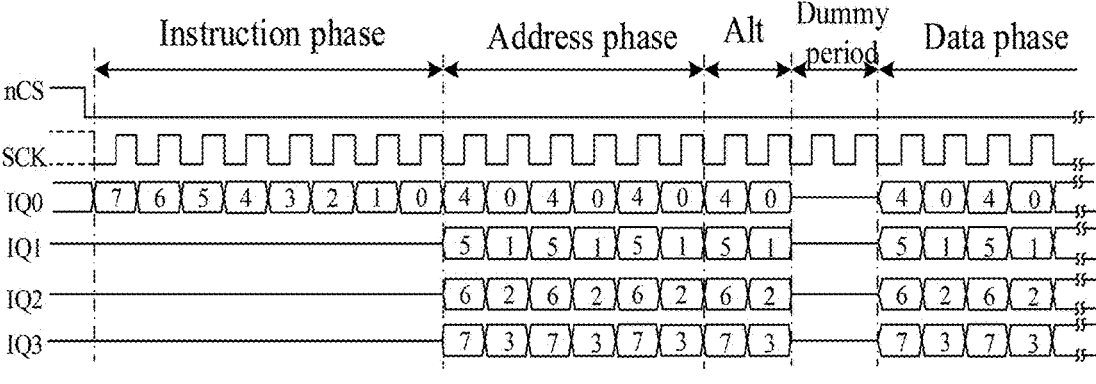
FIG. 3 is a timing diagram in a single data rate mode.
Figure 4:
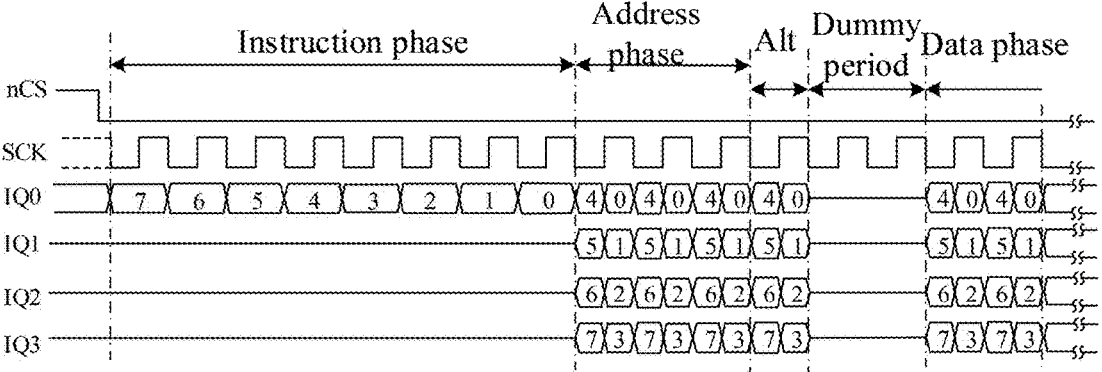
FIG. 4 is a timing diagram in a double data rate mode.

FIG. 3 is a timing diagram in a single data rate mode. FIG. 4 is a timing diagram in a double data rate mode. In the double data rate mode, the control device 10 and the storage device 20 both transmit one bit of data corresponding to the rising edge and the falling edge of the local clock signal SCK, and the external data signal received by the control device 10 which is delayed due to the transmission path from the storage device 20 to the control device 10 causes the local clock signal SCK of the control device 10 and the external data signal to be asynchronous, so that the control device 10 cannot sample correct data. Accordingly, when the local delay module 301 delays the local clock signal SCK, a register may be provided correspondingly to delay the local clock signal SCK by half a period, and a register may be provided correspondingly to delay the local clock signal SCK by one period, so that the local clock signal SCK is delayed by an integer multiple of the first unit of time.

Accordingly, the first register 3011 further includes a first sub-register configured to delay the local clock signal SCK by 0.5 periods and a second sub-register configured to delay the local clock signal SCK by 1 period. By setting values of the first sub-register and the second sub-register, it is possible to delay the local clock signal SCK by an integer multiple of 0.5 periods.

FIGS. 5A~5D are timing diagrams of a local clock signal, a gate signal, and a delayed local clock signal according to one or more embodiments of the present disclosure. Qspi_state represents an instruction/address/data transmitted on an SPI bus (e.g., qspi_state corresponds to IO0~IO3 in FIGS. 3 and 4, or corresponds to IO0~IO7 of OCTAL-SPI (OSPI), and is for transmitting the instruction/address/data), CMD corresponds to an instruction phase, ADDR corresponds to an address phase, DUMMY corresponds to a dummy period, DATA corresponds to a data phase, and IDLE corresponds to a state in which the chip select signal has an invalid level.

The delay in the local clock signal SCK is adjusted by setting the values of the first sub-register and the second sub-register. For example, the value of the first sub-register is set to 0 or 1 (i.e., SSHIFT=0 or 1). Setting the value of the second sub-register to 3'b000 indicates a binary value with a bit width of 3 and a value of 0 (i.e. RXSFT=3'b000). Setting the value of the second sub-register to 3'b001 indicates a binary value with a bit width of 3 and a value of 1 (i.e. RXSFT=3'b001).

Figure 5A:
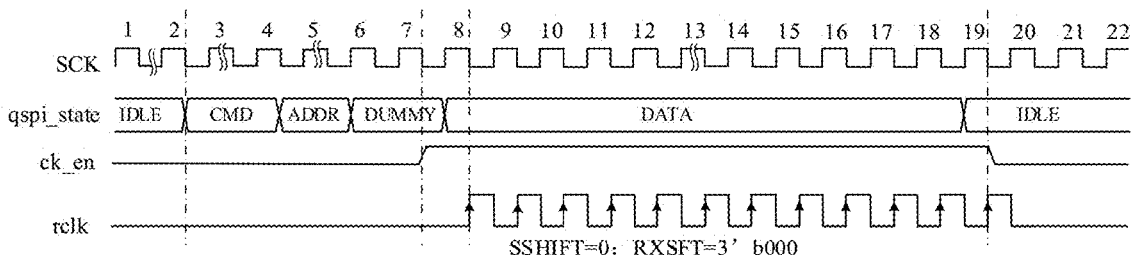
FIGS. 5A~5D are timing diagrams of a local clock signal, a gate signal, and a delayed local clock signal according to one or more embodiments of the present disclosure.

Referring to FIG. 5A, when the value of the first sub-register of the first register 3011 is set to 0 (i.e., SSHIFT=0) and the value of the second sub-register of the first register 3011 is set to 3'b000 (i.e., RXSFT=3'b000), the local delay module 301 is configured to not delay the local clock signal SCK. Since the local clock signal SCK also needs to be controlled by control of the gate signal ck_en, the first rising edge of the delayed local clock signal rclk lags the rising edge of the gate signal ck_en by one period, and the first rising edge of the delayed local clock signal rclk corresponds to the falling edge of the eighth pulse of the local clock signal SCK.

Figure 5B:
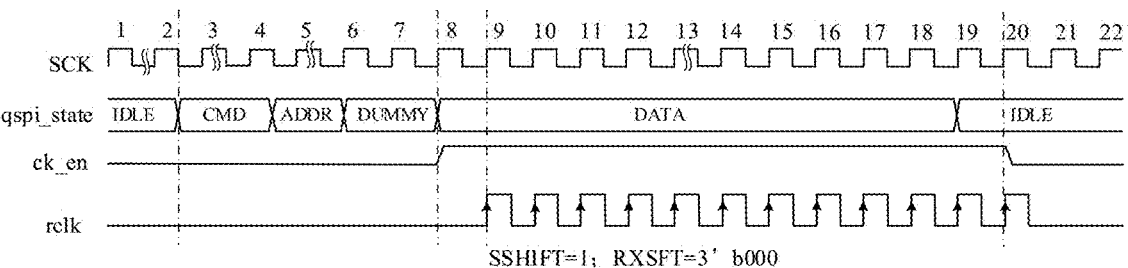

Referring to FIG. 5B, when the value of the first sub-register of the first register 3011 is set to 1 (i.e., SSHIFT=1) and the value of the second sub-register of the first register 3011 is set to 3'b000 (i.e., RXSFT=3'b000), the local delay module 301 is configured to delay the local clock signal SCK by 0.5 periods. Thus, compared to a case where the value of the first sub-register of the first register 3011 is set to 0 and the value of the second sub-register of the first register 3011 is set to 3'b000 as shown in FIG. 5A, when the value of the first sub-register of the first register 3011 is set to 1, and the value of the second sub-register of the first register 3011 is set to 3'b000 as shown in FIG. 5B, the first rising edge of the delayed local clock signal rclk corresponds to the rising edge of the ninth pulse of the local clock signal SCK, thereby delaying the local clock signal SCK by 0.5 periods.

Figure 5C:
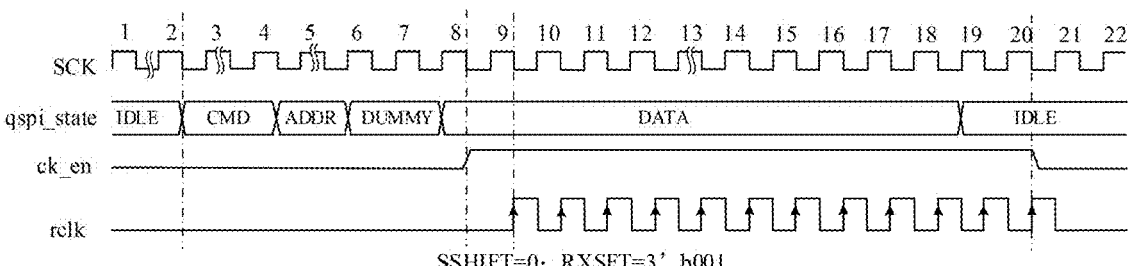

Referring to FIG. 5C, when the value of the first sub-register of the first register 3011 is set to 0 (i.e., SSHIFT=0) and the value of the second sub-register of the first register 3011 is set to 3'b001, the local delay module 301 is configured to delay the local clock signal SCK by 1 period. Thus, compared to a case where the value of the first sub-register of the first register 3011 is set to 1 and the value of the second sub-register of the first register 3011 is set to 3'b000 as shown in FIG. 5B, when the value of the first sub-register of the first register 3011 is set to 0, and the value of the second sub-register of the first register 3011 is set to 3'b001, the first rising edge of the delayed local clock signal rclk corresponds to the falling edge of the ninth pulse of the local clock signal SCK, thereby delaying the local clock signal SCK by 1 period.

Figure 5D:
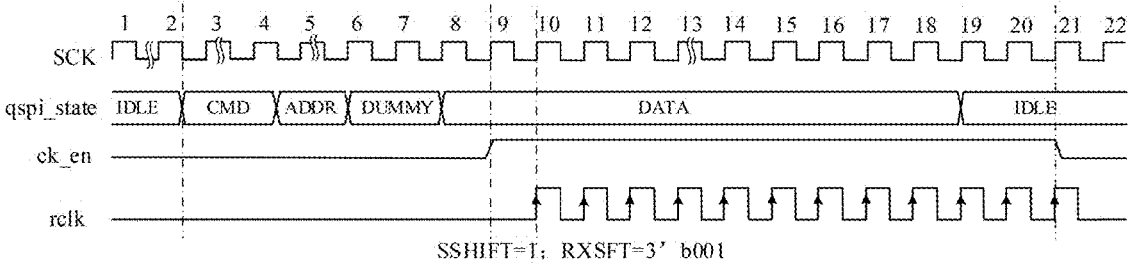

Referring to FIG. 5D, when the value of the first sub-register of the first register 3011 is set to 1 (i.e., SSHIFT=1) and the value of the second sub-register of the first register 3011 is set to 3'b001 (i.e., RXSFT=3'b001), the local delay module 301 is configured to delay the local clock signal SCK by 1.5 periods. Thus, compared to a case where the value of the first sub-register of the first register 3011 is set to 0 and the value of the second sub-register of the first register 3011 is set to 3'b001 as shown in FIG. 5C, when the value of the first sub-register is set to 1, and the value of the second sub-register is set to 3'b001, the first rising edge of the delayed local clock signal rclk corresponds to the falling edge of the tenth pulse of the local clock signal SCK, thereby delaying the local clock signal SCK by 1.5 periods.

It will be appreciated that 3-bit binary code are stored in the second sub-register, and the value the second sub-register is a binary value ranging from 000 to 111 (i.e., a decimal value ranging from 0 to 7). Further, when the value of the second sub-register ranges from 010 to 111, the local clock signal SCK may be delayed by 2~7 periods by the configuration of the second sub-register, and it is further configured whether to delay the local clock signal SCK by 0.5 periods in conjunction with the value of the first sub-register (i.e., SSHIFT=0 or 1).

It will be appreciated that the bit number of the binary code stored in the second sub-register may not be limited to 3. For example, the bit number of the binary code stored in the second sub-register may be 1, 2, 4, 5, 6, 7, 8, 9, 10, 11, 12, etc.

Alternatively, the bit number of the binary code stored in the second sub-register may be determined based on a phase difference between the external data signal and the local clock signal SCK. As in the actual test, when a system clock frequency of the control device 10 is set to 200 MHz, the external data signal is asynchronous with the local clock signal SCK by about 8.1 nanoseconds. The bit number of the binary code stored in the second sub-register may be set to 3, so that the local delay module 301 can delay the local clock signal SCK by 0~7.5 periods by the first sub-register and the second sub-register.

It should be noted that the last pulse of the delayed local clock signal rclk shown in FIGS. 5A~5D is to write data into the data buffer so as to reduce delay caused by the signal passing through respective logic devices inside the control device 10.

Although the local clock signal SCK may be coarsely adjusted by the local delay module 301 to obtain the delayed local clock signal rclk, the control device 10 may not be able to sample correct data when sampling the external clock signal DQS with the delayed local clock signal rclk. When the system clock frequency of the control device 10 is set to 200 MHz, the external data signal is asynchronous with the local clock signal SCK by about 8.1 nanoseconds. The local clock signal SCK is delayed by 1.5 periods by the local delay module 301 to obtain the delayed local clock signal rclk whose asynchronous time difference with the external clock signal DQS is within 0.5 periods. However, an asynchronous time difference of 0.6 nanoseconds between the delayed local clock signal rclk and the external data signal is still not compensated.

Moreover, although the external clock signal DQS and the external data signal Din are synchronous signals, timing requirements of state setup of a flip-flop shown in FIG. 1B may not be satisfied in practice. If the control device 10 directly applies the external clock signal DQS to sample the external data signal, there may be a problem of sampling accuracy. Therefore, a fine adjustment may be performed on the delayed local clock signal rclk and the external clock signal DQS using the first delay module 303. That is, the first delay module 303 is used to delay the basic clock signal bclk by a second time length.

Alternatively, in one or more embodiments, to perform a fine adjustment on the delayed local clock signal rclk and the external clock signal DQS, the second time length is made less than or equal to the first unit of time (e.g., 0.5 periods) to control accuracy of the delay performed on the basic clock signal bclk by the first delay module 303.

Alternatively, the first delay module 303 delays the basic clock signal bclk in steps of a picosecond (ps).

Alternatively, referring still to FIG. 2, the first delay module 303 includes a second register 3031 and one of a Clock Phase Delay Module (CPDM) and a delay chain (DLC).

The first delay module 303 adjusts one period of the basic clock signal bclk by P stages of time lengths, and the second time length is set by setting M of N bits in P second registers 3031 (e.g., P of 12 second registers DLSTCNT[6:0] shown in FIG. 7), where M is less than or equal to N, and P is set by the third register.

Figure 6:
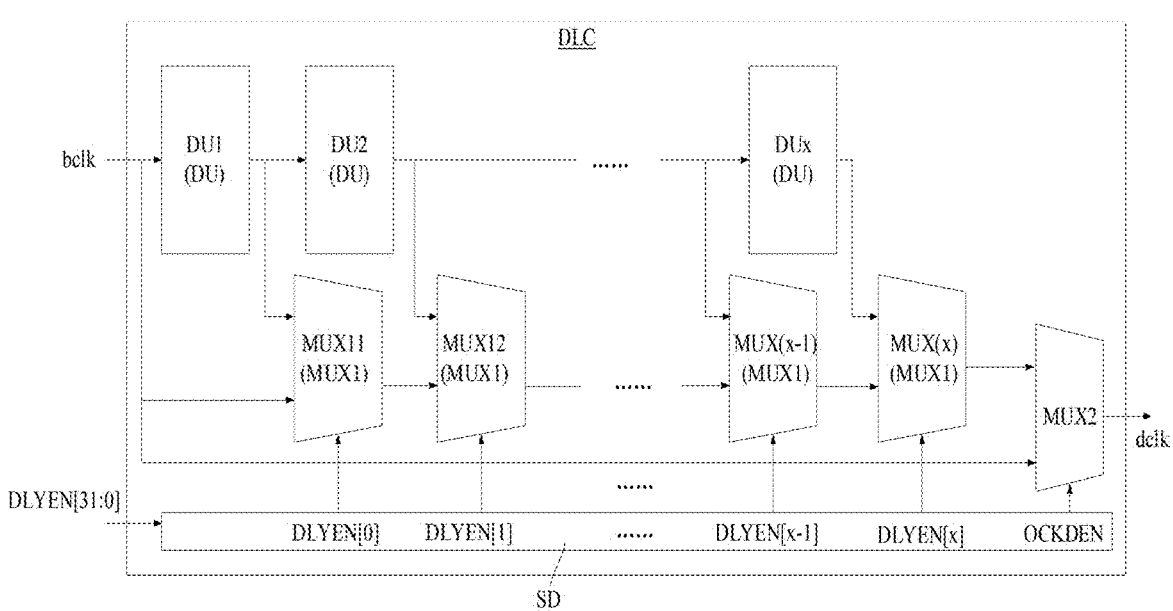
FIG. 6 is a schematic block diagram of a delay chain according to one or more embodiments of the present disclosure.

FIG. 6 is a schematic diagram of a structure of a delay chain DLC according to one or more embodiments of the present disclosure. The delay chain DLC includes multiple delay units DU, multiple first multiplexers MUX1, a second multiplexer MUX2, and a signal distributor SD.

Alternatively, each of the multiple delay units DU includes, but is not limited to, a D flip-flop. Each delay unit DU may provide the same or substantially the same delay amount.

The multiple delay units DU are sequentially connected in series and the multiple first multiplexers MUX1 are sequentially connected in series. A first delay unit DU0 of the multiple delay units DU receives a basic clock signal bclk, the first multiplexer MUX10 of the multiple first multiplexers MUX1 receives the basic clock signal bclk, and the second multiplexer MUX2 receives the basic clock signal bclk. An output terminal of each delay unit DU is electrically connected to an input terminal of one of the first multiplexers MUX1, and a selection terminal of each of the multiple first multiplexers MUX1 is electrically connected to the second register 3031 to delay the basic clock signal bclk by the second time length based on the configuration of the second register 3031. The last first multiplexer MUX1n of the multiple first multiplexers MUX1 is electrically connected to the second multiplexer MUX2 configured to output the first delayed clock signal dclk.

Alternatively, the second register 3031 supplies a delay signal to the selection terminal of each of the multiple first multiplexers MUX1 by a decoder. The delay signal is represented as a level signal transmitted by the bus, and the value of the delay signal ranges from 0 to N-th power of 2. The second register 3031 may store N-bit binary code.

A signal distributor SD receives the delay signal and correspondingly controls the selection terminal of each of the multiple first multiplexers MUX1 based on the delay signal to set a corresponding first multiplexer MUX1 so as to correspondingly control the multiple delay units DU to delay the basic clock signal bclk. For example, the signal distributor SD receives the delay signal DLYEN[31:0] to divide the delay signal DLYEN[31:0] into DLYEN[0], DLYEN[1], . . . , DLYEN[31] to correspondingly control the selection terminal of each of the multiple first multiplexers MUX1.

Alternatively, only one level signal in the delay signal DLYEN[31:0] has a high-level state, and each of remaining multiple level signals has a low-level state. For example, the second register 3031 may store 5-bit binary code, and the first bit and the third bit in the second register 3031 are selected to be set (i.e., a binary value corresponding to 01010), then the tenth level signal in the delay signal DLYEN[31:0] has a high-level state. The signal distributor SD sets DLYEN[0]~DLYEN[10] based on the delay signal, thereby selecting the first multiplexer MUX10~ the tenth first multiplexer MUX19, thereby controlling the first delay unit DU0~ the tenth delay unit DU9 to delay the basic clock signal bclk.

Alternatively, the signal distributor SD is further configured to generate a bypass level signal OCKEN having two logic states (i.e., a logic 0 and a logic 1). The second multiplexer MUX2 is configured to select the basic clock signal bclk or the first delayed clock signal dclk for output based on the logic state of the bypass level signal OCKEN.

Figure 7:
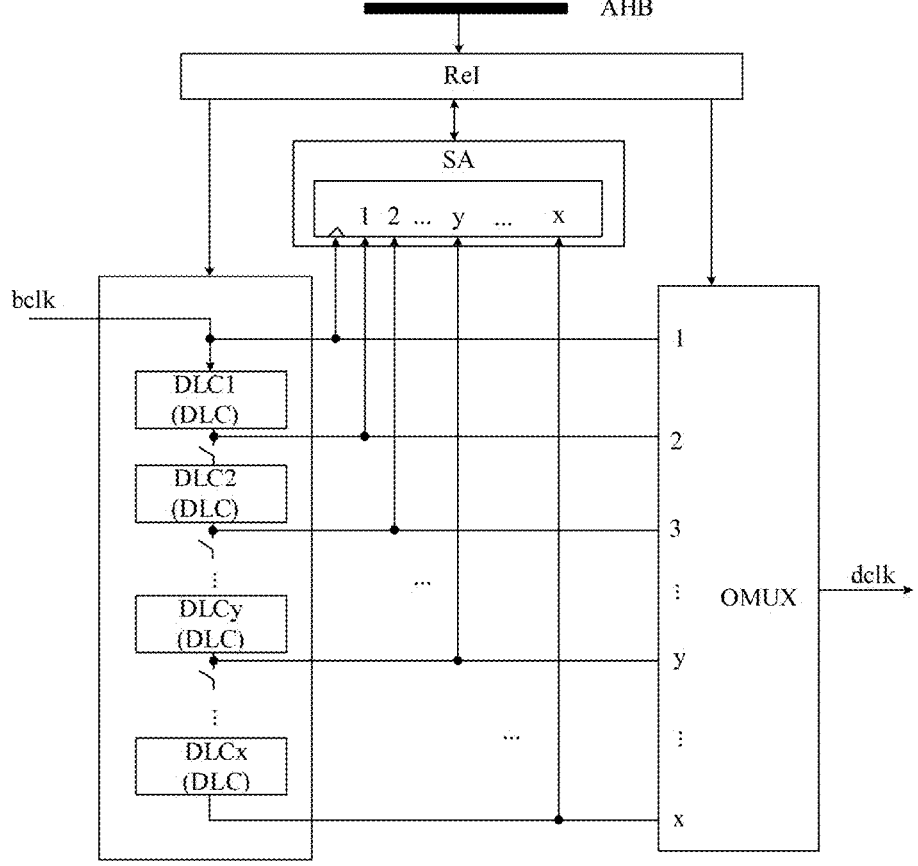
FIG. 7 is a schematic block diagram of a clock phase delay module according to one or more embodiments of the present disclosure.

FIG. 7 is a schematic diagram of a structure of a clock phase delay module according to one or more embodiments of the present disclosure. The clock phase delay module CPDM includes multiple delay chains DLC connected in series, a sampler SA, a register interface REI, and an output multiplexer OMUX. The clock phase delay module CPDM communicates with the bus AHB or AXI through the register interface REI, the sampler SA is electrically connected to the register interface REI and the output multiplexer OMUX, the multiple delay chains DLC are connected in series and are electrically connected to the output multiplexer OMUX.

Alternatively, the clock phase delay module CPDM includes x delay chains DLC. The structure of each delay chain DLC may be configured with reference to FIG. 6.

The clock phase delay module CPDM illustrated in FIG. 7 includes 12 delay chains DLC (i.e., x=12), each of which includes 128 delay units DU.

Alternatively, with reference to FIGS. 3 and 7, when the basic clock signal bclk is delayed, the clock phase delay module CPDM selects a corresponding delay chain DLC based on a delay chain selection signal cpsel, and a value set by the second register 3031 is converted into the delay signal by the decoder to be output to a selection terminal of the multiplexer in the delay chain DLC, thereby controlling the corresponding delay unit DU to delay the basic clock signal bclk and output the first delayed clock signal dclk by the output multiplexer OMUX.

Alternatively, the delay chain selection signal cpsel is a value configured for the third register.

In one or more embodiments in which the first delay module 303 shown in FIG. 7 is implemented as a clock phase delay module CPDM, the first delay module 303 further configures enable of the delay chain DLC by the third register (e.g., the third register DLLEN[11:0]), i.e., configures stages in which the clock phase delay module CPDM is used. As shown in FIG. 7, there are a total of 12 delay chains DLC (x=12), and one bit in the third register DLLEN[11:0] is set to represent that one corresponding delay chain DLC in the 12 delay chains of the first delay module 303 is enabled. Setting P bits represent enabling P delay chains DLC in the clock phase delay module CPDM.

In one or more embodiments of FIG. 7, based on 1 period by which the basic clock signal bclk is delayed and minimum adjustment accuracy or step size (i.e., delay time length of each delay unit DU in each delay chain DLC of the clock phase delay module CPDM) of the clock phase delay module CPDM, how many stages in x stages are required for the second time length at most is determined (for example, it is determined that P stages are required). Then values of respective second registers 3031 of the P levels may be set based on the second time length. For example, if one period of the basic clock signal bclk is 2.6 ns and the minimum adjustment accuracy of the clock phase delay module CPDM is 20 ps, Up to 130 delay units (DU) are required to achieve the adjustment of the second time length (a maximum value is one period of bclk). Therefore, only 2 of x stages of the first delay module 303 need to be enabled to meet the requirements (that is, P=2, for example, only the first-stage delay chain DLC1 and the second-stage delay chain DLC2 of the 12 delay chains of the clock phase delay module CPDM need to be enabled). When delaying the basic clock signal bclk, seven bits of the second register 3031 (DLSTCNT[6:0]) of the first-stage delay chain DLC1 are all set (that is, 128 delay units DU of the first-stage delay chain DLC1 are all turned on), the second bit of the second register 3031 (DLSTCNT[6:0]) of the second-stage delay chain DLC2 is set (that is, first two delay units DU of the second level delay chain DLC2 are turned on based on a binary value of 0000010), and each of the lowest two bits of the third register DLLEN[11:0] is set to 1 (that is, set P=2), so that the basic clock signal bclk is delayed by the second delay time length.

In other one or more embodiments of FIG. 7, the basic clock signal bclk is also adjusted by P stages when delayed by 1 period. The difference is that the third register is configured that P=x, i.e., all x delay chains DLC of the clock phase delay module CPDM are enabled (as shown in FIG. 7, x=12, all 12 delay chains DLC1~DLC12 are enabled, and each of 12 bits of the third register DLLEN[11:0] is set to 1, i.e., P=12). The maximum value of the second time length (that is, one period by which the basic clock signal bclk is delayed) is equally divided into 12 parts, and how many delay units DU need to be turned on for each stage is configured by the second register 3031 based on the delay time length of each stage. For example, in a case where the basic clock signal bclk has a period of 2.4 ns and the period is equally divided into 12 parts, time length of each part is 200 ps. If the minimum adjustment accuracy of the clock phase delay module CPDM is 20 ps, 10 delay units DU of each of the 12 delay chains DLC1~DLC12 need to be turned on. It is simple to program since the value of each of the 12 second registers 3031 (DLSTCNT[6:0]) is a decimal number 10. However, the disadvantage is that the adjustment step or accuracy of the second time length must be 12 times delay time length of a single delay unit DU of the CPDM, the adjustment accuracy is low, and the adjustment method is applicable to a case where the frequency of the basic clock signal bclk to be adjusted is low.

It should be noted that a sum of P stages of time lengths may be equal to or not equal to one period.

It should be noted that the clock phase delay module CPDM differs from the delay chain DLC in that the clock phase delay module CPDM also needs to sample the level of the delayed basic clock signal bclk with an input basic clock signal bclk. When a level of a next stage can be sampled, it indicates that the basic clock signal bclk has been delayed by one period. Thereafter, a scan completion flag is set, and the second register 3031 configures a phase corresponding to the number of equal parts taken from N equal parts of one period.

It will be appreciated that in addition to adjusting the reception operating clock of the control device 10, a transmission operating clock of the control device 10 may also be adjusted to compensate for delay of a signal in the control device 10 and the transmission path of the control device 10.

FIG. 8 is a schematic diagram of a structure of a second delay module for adjusting the transmission operating clock of the control device 10 according to one or more embodiments of the present disclosure. Alternatively, in some embodiments, the clock control device 102 further includes a second delay module 304. The second delay module 304 is configured to delay the local clock signal SCK by time length within 0.5 periods to obtain a delayed clock signal CK1, which is used by the control device 10 as a transmission operating clock for transmitting an internal data signal DAi to the storage device 20. By delaying the local clock signal SCK, the time at which the storage device 20 drives the output of the external data signal is delayed, so that the reception operating clock of the control device 10 tends to be synchronized with the external data signal received by the control device 10.

Alternatively, in one or more embodiments, the second delay module 304 is further configured to delay the internal data signal DAi by time length within 0.5 periods to obtain a delayed data signal DA1.

Alternatively, in one or more embodiments, the second delay module 304 includes one of the clock phase delay module CPDM and the delay chain DLC. The structure of the second delay module 304 may be configured with reference to FIGS. 6~7, and details are not described herein.

Alternatively, the second delay module 304 may delay at least one of the internal data signal DAi and the local clock signal SCK by configuration of a fourth register.

Alternatively, in one or more embodiments, the clock control device 102 operates in a double data rate mode, and the frequency of the local clock signal SCK is equal to the frequency of the system clock of the control device 10 (e.g., the frequency of the system clock of the control device 10 is 200 MHz, and the local clock signal SCK is also 200 MHz in a case where the system clock is not divided).

In a case where the clock control device 102 operates in the double data rate mode and the frequency of the local clock signal SCK is equal to the system clock of the control device 10, if the control device 10 changes data at the falling edge of the local clock signal SCK, there may be an error when the storage device 20 acquires data at the rising edge of the local clock signal SCK. In order to make the data acquired by the storage device 20 error-free, when the clock control device 102 operates in the double data rate mode and the frequency of the local clock signal SCK is equal to the system clock of the control device 10, the second delay module 304 delays the local clock signal SCK by time length within 0.5 periods and delays the output of the internal data signal DAi by time length within 0.5 periods, so that the rising edge of the local clock signal SCK is delayed to a central position of an original internal data signal Dai, thereby enabling the storage device 20 to sample the data of the delayed internal data signal DA1.

Alternatively, in one or more embodiments, each of the first delay module 303 and the second delay module 304 is disposed in a microcontrol unit.

FIG. 9 is a flowchart of a clock control method for a serial peripheral interface according to one or more embodiments of the present disclosure. According to one or more embodiments of the present disclosure, a clock control method for a serial peripheral interface includes steps S1~S3.

At step S1, the local clock signal SCK and the external clock signal DQS are received, and the local clock signal SCK is delayed to output the delayed local clock signal rclk.

At step S2, one of the external clock signal DQS and the delayed local clock signal rclk is selected as the basic clock signal bclk based on the clock selection control signal rcksel.

At step S3, a phase delay is performed on the basic clock signal bclk to output the first delayed clock signal dclk. The first delayed clock signal dclk is used by the control device 10 as the reception operating clock for sampling the external data signal transmitted by the storage device 20.

Alternatively, as shown in FIG. 2, the local clock signal SCK is delayed by the local delay module 301, the basic clock signal bclk is selected by the clock selector 302 based on the clock selection control signal rcksel, and a phase delay is performed on the basic clock signal bclk by the first delay module 303.

FIG. 10 is a flowchart of generating a delayed local clock signal according to one or more embodiments of the present disclosure. Optionally, step S1 includes steps S11~S12.

At step S11, after delaying the local clock signal SCK by an integer multiple of the first unit of time based on a preset input delay value, the gate signal ck_en is enabled.

At step S12: the delayed local clock signal SCK is gated based on the gate signal ck_en to generate the delayed local clock signal rclk.

Alternatively, as shown in FIG. 2, the preset input delay value may be configured by the first register 3011 to delay the local clock signal SCK by an integer multiple of the first unit of time. The gate signal ck_en is enabled by the delay control unit 3012 after the local clock signal SCK is delayed by an integer multiple of the first unit of time. The delayed local clock signal rclk is generated by the gate unit 3013.

Alternatively, in one or more embodiments, S3 includes step S31. At step S31, the basic clock signal bclk is delayed by a second time length less than or equal to the first unit of time based on the preset input delay value to be output as the first delayed clock signal dclk.

The basic clock signal bclk is delayed by the second time length by the first delay module 303 to be output as the first delayed clock signal dclk.

In addition to adjusting the reception operating clock of the control device 10 by the step shown in FIG. 9, the transmission operating clock of the control device 10 may also be adjusted. Alternatively, in one or more embodiments, the clock control method further includes: in the double data rate mode, when the frequency of the local clock signal SCK is equal to the frequency of the system clock of the control device 10, the local clock signal SCK is delayed by time length within 0.5 periods based on a preset output delay value, and the internal data signal (i.e., DAi) is delayed by 0.5 periods to be used by the control device 10 as the transmission operating clock for transmitting the internal data signal to the storage device 20.

Alternatively, the preset output delay value may be configured by the fourth register configuration, so that in the double data rate mode and when the frequency of the local clock signal SCK is equal to the system clock of the control device 10, the second delay module 304 delays the local clock signal SCK by time length within 0.5 periods and delays the internal data signal by 0.5 periods.

Alternatively, it is necessary to obtain the preset input delay value and the preset output delay value by a scanning test procedure before configuring based on preset input delay value (for example, step S11) and the preset output delay value (for example, step S31). Thus, before the configuring based on the preset input delay value and the preset output delay value, a scanning test step of obtaining the preset input delay value and the preset output delay value is further included.

Figure 11:
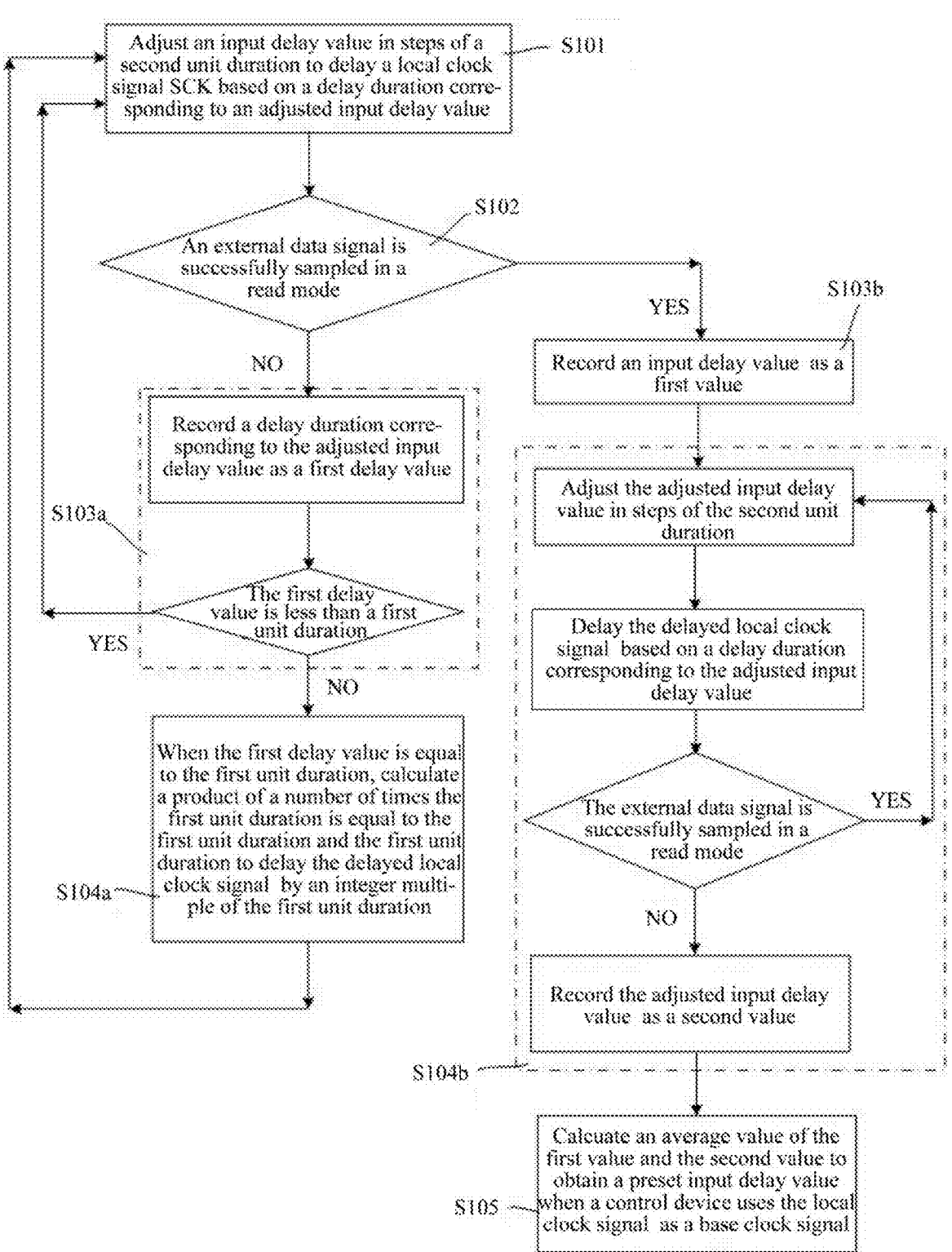
FIG. 11 is a flowchart of a process of obtaining a preset input delay value when a local clock signal is used as a reference clock signal according to one or more embodiments of the present disclosure.

FIG. 11 is a flowchart of obtaining a preset input delay value when the local clock signal is used as a reference clock signal according to one or more embodiments of the present disclosure. Before step S11, the method includes steps S101~S103.

At step S101, the input delay value is adjusted in steps of the second unit of time to delay the local clock signal SCK based on the delay time length corresponding to the input delay value.

At step S102, in a read mode, the delayed local clock signal SCK is selected to sample the external data signal.

When the external data signal cannot be successfully sampled in step S102, step S103*a* is executed. At step S103*a*, the delay time length corresponding to the input delay value is recorded as the first delay value, and whether the first delay value is less than the first unit of time is determined.

When a determination result at step S103*a* is YES (that is, when the first delay value is less than the first unit of time), steps S101~step S102 are repeatedly executed, and when the external data signal cannot be successfully sampled in step S102, step S103*a* is repeatedly executed.

When the determination result in step S103*a* is NO (for example, when the first delay value is equal to the first unit of time), step S104*a* is executed. At step S104*a*, a product of the number of times the first unit of time is equal to the first unit of time and the first unit of time is calculated to delay the local clock signal SCK by an integer multiple of the first unit of time. After the execution of step S104*a*, steps S101~S102 is repeatedly executed again. When the external data signal cannot be successfully sampled in step S102, step S103*a* is repeatedly executed. When the determination result of step S103*a* is NO, step S104*a* is repeatedly executed.

When the external data signal is successfully sampled in step S102, steps S103*b* and S104*b* are performed.

At step S103*b*, an input delay value is recorded as a first value.

At step S104*b*, the input delay value is adjusted in steps of the second unit of time, the local clock signal SCK is delayed based on the delay time length corresponding to the input delay value, the external data signal is sampled in the read mode, and the corresponding input delay value is recorded as a second value until the external data signal cannot be successfully sampled in the read mode.

At step S105, an average of the first value and the second value is calculated to obtain a preset input delay value when the control device 10 uses the local clock signal SCK as the basic clock signal bclk.

The second unit of time corresponds to delay time length that each delay unit DU of the first delay module 303 can achieve. Alternatively, the second unit of time is in picoseconds.

Referring to FIGS. 3-4, in the single data rate mode, each of the control device 10 and the storage device 20 transmits data at the falling edge of the local clock signal SCK, and samples data at the rising edge of the local clock signal SCK, and the rising edge of the local clock signal SCK corresponds to a central position of the data. Thus, in the single data rate mode, the command and data transmitted from the control device 10 to the storage device 20 can be accurately received by the storage device 20, but the data fed back from the storage device 20 to the control device 10 may not be received by the control device 10 due to a delay in the transmission path. In the double data rate mode, each of the control device 10 and the storage device 20 transmit one bit of data at both the rising edge and the falling edge of the local clock signal SCK. Thus, when the control device 10 transmits and receives data, the data transmitted by the control device 10 may not be received by the storage device 20 due to a delay in the transmission path, and the data transmitted by the storage device 20 may not be received by the control device 10. Therefore, the step shown in FIG. 11 may be performed in the single data rate mode so as to determine the preset input delay value when the control device 10 receives the data transmitted by the storage device 20 as a receiving side. The preset input value determined in the single data rate mode is applicable to the double data rate mode.

Thus, before step S101, the method further includes steps S1001-S1002 as shown in FIG. 14.

At step S1001, the system clock of the control device 10 is set to a first frequency, the storage device 20 is initialized in a single data rate mode, and data is written to the storage device 20.

At step S1002, the system clock of the control device 10 is set to the second frequency, and the data of the storage device 20 is sampled in the single data rate mode and in a state in which the first delay module 303 is not enabled. If the data of the storage device 20 can be successfully sampled, a sample success flag bit is set.

The first frequency may be 30 MHz and the second frequency may be 200 MHz.

Alternatively, as shown in FIG. 7, the first delay module 303 may be enabled by A first delay enable signal, and the number of delay chains DLC invoked in the first delay module 303 may configured by the third register. If the delay chain selection signal is set to 1, one delay chain DLC in the first delay module 303 is selected to be invoked.

Alternatively, as shown in FIG. 6, the number of delay units DU invoked in the first delay module 303 may be determined based on the input delay value, so that the local clock signal SCK is delayed by applying the delay time length that can be achieved by the invoked delay units DU.

Alternatively, the value of the input delay value ranges from 0 to X. X is the number of delay units DU included in the first delay module 303.

Alternatively, when the input delay value is set to 1, one delay unit DU is invoked accordingly. Accordingly, the first delay module 303 delays the local clock signal based on the delay time length (i.e., the second unit of time) that can be achieved by one delay unit DU.

Alternatively, the number of delay units DU invoked is configured by the second register 3031. The input delay value is a value configured by the second register 3031.

To verify whether the setting of the input delay value is appropriate, after the local clock signal SCK is delayed based on the input delay value, the controller 10 samples the external data signal in the read mode by applying the delayed local clock signal SCK, so as to verify whether the setting of the input delay value is appropriate based on whether the controller 10 can sample data in the read mode.

The delay time length that each delay unit DU can achieve is less than the first unit of time, and the input delay value may be incremented from 0 or decremented from X. Thus, when the input delay value is incremented from 0 or decremented from X to a case where the delay time length that can be achieved by the invoked delay units DU is equal to the first unit of time or an integer multiple of the first unit of time, the local delay module 301 can be directly invoked to delay the local clock signal SCK so as to reduce the number of delay units DU invoked in the first delay module 303. Therefore, by determining whether the first delay value is less than the first unit of time, the configuration of the first sub-register and the second sub-register in the local delay module 301 can be obtained. That is, the delay time length of the local clock signal SCK by the local delay module 301 can be obtained from the product of the number of times the first delay time value is equal to the first unit of time and the first unit of time.

Thus, in the obtaining of the preset input delay value, two loops are nested. The inner loop is configured to adjust the input delay value with the second unit of time so that multiple delay units DU of the first delay module 303 delay the local clock signal SCK. The outer loop is configured to delay the local clock signal SCK by an integer multiple of the first unit of time by the local delay module 301.

Alternatively, in executing the steps shown in FIG. 11, the input delay value is decremented from X to save the scan time. Alternatively, when the input delay value is decremented from X, the input delay value is decremented by one each time to control the compensation accuracy.

In order to make a time point at which when the control device 10 samples the external data signal is at the central position the external data signal when executing the step shown in FIG. 11, an average value is calculated based on a first value corresponding to a successful sampling of the external data signal for the first time and the input delay value (i.e., a second value) corresponding to the failure to successfully sample the external data signal again after the successful sampling of the external data signal for the first time, as the preset input delay value in a case where the local clock signal SCK is the basic clock signal bclk.

Alternatively, the read mode includes an indirect read mode.

According to the steps shown in FIG. 11, it has been determined that the control device 10 receives the data transmitted by the storage device 20 as the receiving side, and the preset input delay value in a case where the local clock signal SCK is the basic clock signal bclk has been determined. Therefore, based on the steps shown in FIG. 11, the preset output delay value in a case where the control device 10 serves as an output side may be further obtained.

Accordingly, FIG. 12 is a flowchart of a process of obtaining the preset output delay value according to one or more embodiments of the present disclosure. After step S105, the method includes steps S106-S1010.

At step S106, in the double data rate mode, the frequency of the local clock signal SCK is set to be the frequency of the system clock of the control device 10, and the output delay value is adjusted in steps of a third unit of time, so that the local clock signal SCK is delayed based on the delay time length corresponding to the output delay value.

At step S107, the external data signal is sampled in the read mode.

When the external data signal cannot be successfully sampled in step S107, steps S106~S107 are repeatedly executed.

When the external data signal is successfully sampled in step S107, steps S108-1010 are executed.

At step S108, the output delay value is recorded as a third value.

At step S109, the output delay value is adjusted in steps of the third unit of time, the local clock signal SCK is delayed based on the delay time length corresponding to the output delay value, the external data signal is sampled in the read mode, and the corresponding output delay value is recorded as a fourth value until the external data signal cannot be sampled in the read mode.

At step S1010, an average value of the third value and the fourth value is calculated to obtain a preset output delay value.

The third unit of time is the delay time length that each delay unit DU of the second delay module 304 can achieve.

Alternatively, in the double data rate mode, the frequency of the local clock signal SCK is set to be 200 MHz.

Alternatively, the second delay module 304 may be enabled by the second delay enable signal, and the number of delay units DU invoked in the second delay module 304 is determined based on the output delay value, so that the local clock signal SCK is delayed by applying the delay time length that can be achieved by the invoked delay units DU.

Alternatively, as shown in FIG. 6, the output delay value ranges from 0 to Y. Y is the number of delay units DU included in the second delay module 304. Alternatively, when the output delay value is set to 1, one delay unit DU is invoked, and the second delay module 304 delays the local clock signal based on the delay time length (i.e., a third unit of time) that can be realized by one delay unit DU. Alternatively, in performing the steps shown in FIG. 12, the output delay value is incremented from 0.

Alternatively, the number of delay units DU invoked is configured by the fourth register. The output delay value is a value configured by the fourth register.

To verify whether the setting of the output delay value is appropriate, after the local clock signal SCK is delayed based on the output delay value, the controller 10 is configured to sample the external data signal in the read mode by applying the delayed local clock signal SCK, so as to verify whether the setting of the output delay value is appropriate based on whether the controller 10 can sample the data in the read mode.

An average value is calculated based on the third value corresponding to a successful sampling of the external data signal for the first time and the output delay value (i.e., the fourth value) corresponding to the failure to successfully sample the external data signal again after the successful sampling of the external data signal for the first time, as the preset output delay value in a case where the local clock signal SCK is the basic clock signal bclk.

Alternatively, after step S1010, the method further includes: switching a memory mapping pattern to sample the external data signal.

In one or more embodiments, the storage module supports the design of the external clock signal DQS, and the control device 10 may sample the external data signal based on the external clock signal DQS. Thus, the preset input delay value in a case where the external clock signal DQS is used as the basic clock signal bclk may be obtained based on the determined preset output delay value.

Figure 13:
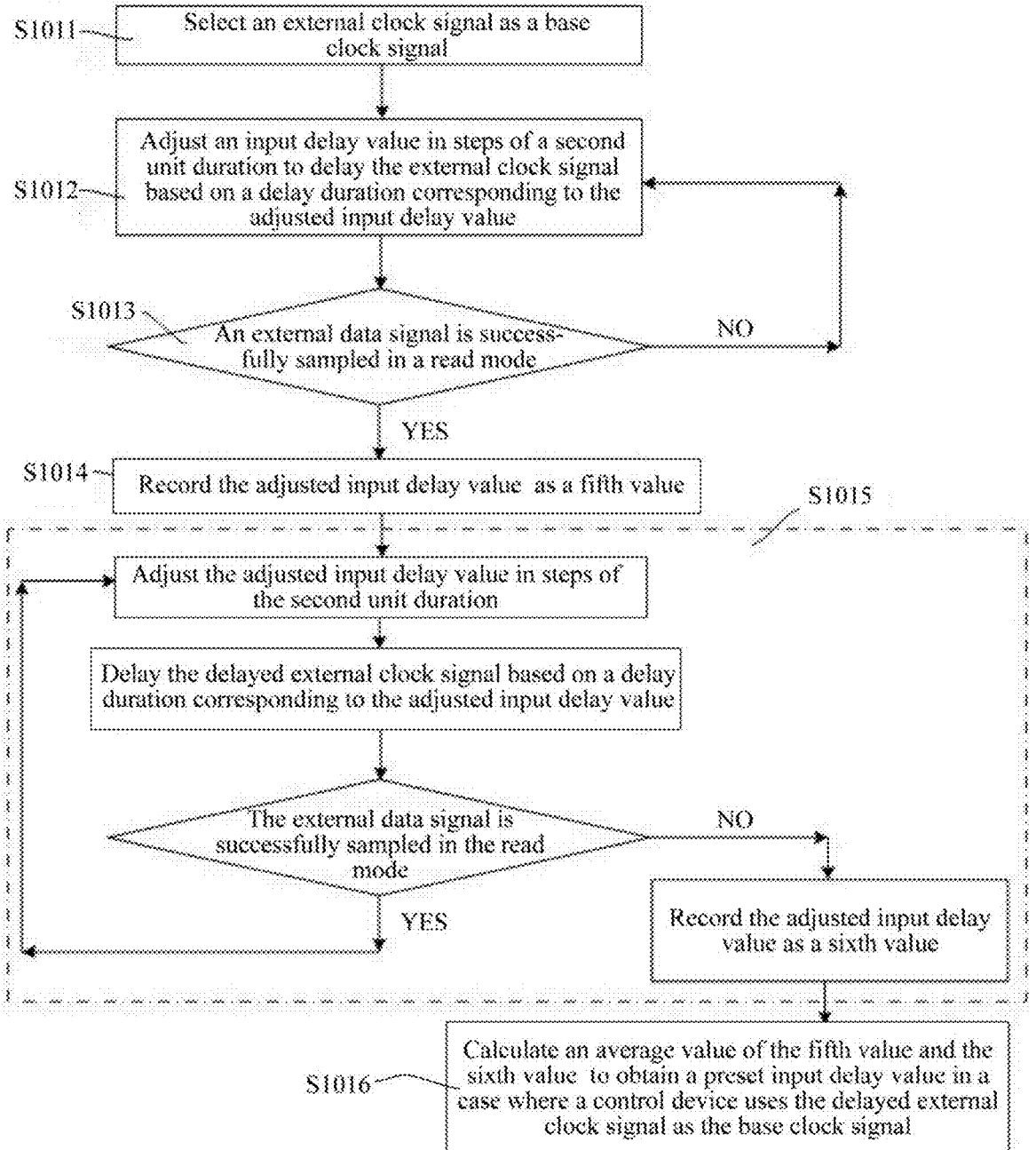
FIG. 13 is a flowchart of a process of obtaining a preset input delay value when an external clock signal is used as a reference clock signal according to one or more embodiments of the present disclosure.

Accordingly, FIG. 13 is a flowchart of obtaining a preset input delay value when an external clock signal is used as a reference clock signal according to one or more embodiments of the present disclosure. After step S1010, the method includes steps S1011~S1013.

At step S1011, the external clock signal DQS is selected as the basic clock signal bclk.

At step S1012, the input delay value is adjusted in steps of the second unit of time to delay the external clock signal DQS based on the delay time length corresponding to the input delay value.

At step S1013, in the read mode, the delayed external clock signal DQS is selected to sample the external data signal.

When the external data signal cannot be successfully sampled in step S1013, the steps S1012~S1013 are repeatedly executed.

When the external data signal is successfully sampled in step S1013, the steps S1014~S1016 are executed.

At step S1014, the input delay value is recorded as a fifth value.

At step S1015, the input delay value is adjusted in steps of the second unit of time, the external clock signal DQS is delayed based on the delay time length corresponding to the input delay value, the external data signal is sampled in the read mode, and the corresponding input delay value is recorded as a sixth value until the external data signal cannot be sampled in the read mode.

At step S1016, an average value of the fifth value and the sixth value is calculated to obtain a preset input delay value in a case where the control device 10 uses the external clock signal DQS as the basic clock signal bclk.

In the steps shown in FIG. 13, the first delay module 303 may still be enabled by the first delay enable signal, the number of delay chains invoked in the first delay module 303 may be selected by the delay chain selection signal, and the number of delay units DU invoked in the first delay module 303 may be determined by the input delay value, so as to delay the external clock signal DQS by applying the delay time length that can be achieved by the invoked delay units DU. It will be appreciated that when performing the steps of FIGS. 11 and 13, the values of respective delay chain selection signals may be different and the values of respective input delay values may be different.

Alternatively, when performing the steps of FIGS. 11 and 13, respective second unit of times may be different.

It will be appreciated that since the external data signal and the external clock signal DQS are transmitted to the control device 10 through similar transmission paths, when the control device 10 uses the external clock signal DQS as the basic clock signal bclk, the obtaining of the preset input delay value may use only one loop (that is, the input delay value is adjusted with the second unit of time, so that multiple delay units DU of the first delay module 303 delay the external clock signal DQS).

After delaying the external clock signal DQS based on the input delay value, the controller 10 samples the external data signal in the read mode using the delayed external clock signal DQS, so to verify whether the input delay value is set appropriately when the corresponding external clock signal DQS is used as the basic clock signal bclk based on whether or not the data can be sampled by the controller 10 in the read mode.

An average value is calculated based on a fifth value corresponding to a successful sampling of the external data signal for the first time and the input delay value (i.e., a sixth value) corresponding to the failure to successfully sample the external data signal again after the successful sampling of the external data signal for the first time, as the preset input delay value in a case where the external clock signal SCK is the basic clock signal bclk.

Alternatively, after step 1016, the method further includes: switching the memory mapping mode to sample the external data signal so as to verify whether the preset input delay value and the setting of the preset input delay value are applicable to the double data rate mode.

According to one or more embodiments of the present disclosure, a local delay module is configured to delay a local clock signal to output a delayed local clock signal to a clock selector, the clock selector is configured to select one of the external clock signal and the first delayed local clock signal to output to a first delay module as a basic clock signal based on a clock selection control signal, and the first delay module is configured to phase-delay the basic clock signal to obtain a delayed basic clock signal. The delayed basic clock signal is used by a control device as a reception operating clock for sampling an external data signal transmitted by a storage device, so as to compensate for the delay of the local clock signal passing through the output path of the control device, the circuit transmission path between the control device and the storage device, and the internal transmission path of the storage device. Thus the delay of the external data signal is compensated, thereby reducing the delay difference between the reception operating clock and the external data signal, without further reducing the data transmission frequency. Thus, the control device can acquire correct data, which is advantageous for improving the data transmission rate between the control device and the storage device, and meeting the high-rate transmission requirement.

Some embodiments of the present disclosure have been described in detail above. The description of the above embodiments merely aims to help to understand the present disclosure. Many modifications or equivalent substitutions with respect to the embodiments may occur to those of ordinary skill in the art based on the present disclosure. Thus, these modifications or equivalent substitutions shall fall within the scope of the present disclosure.

What is claimed is:

1. A clock control device for a serial peripheral interface, wherein the clock control device is disposed in a control device communicable with a storage device through the serial peripheral interface, the clock control device comprising:

a local delay module configured to receive a local clock signal of the control device, and delay the local clock signal to obtain a first delayed local clock signal;

a clock selector configured to receive the first delayed local clock signal and an external clock signal, select one of the first delayed local clock signal and the external clock signal as a basic clock signal, and output the basic clock signal; and a first delay module configured to phase-delay the basic clock signal, to obtain a delayed basic clock signal as a reception operating clock for the control device to sample an external data signal transmitted by the storage device.

2. The clock control device according to claim 1, wherein the external clock signal is from the storage device and synchronized with the external data signal.

3. The clock control device according to claim 1, wherein the local delay module is configured to delay the local clock signal by an integer multiple of a first unit of time.

4. The clock control device according to claim 3, wherein the first unit of time is equal to 0.5 periods of the local clock signal.

5. The clock control device according to claim 3, wherein the local delay module comprises:

a first register for configuring a time delay for the local clock signal, the time delay being equal to the integer multiple of the first unit of time;

a delay control unit for enabling a gate signal upon delaying the local clock signal by the time delay configured by the first register; and a gate unit for gating the local clock signal based on the gate signal to obtain the first delayed local clock signal.

6. The clock control device according to claim 3, wherein the first delay module is configured to delay the basic clock signal by a second time length and comprises one of a clock phase delay module and a delay chain.

7. The clock control device according to claim 6, wherein the second time length is less than or equal to the first unit of time.

8. The clock control device according to claim 6, wherein the first delay module is configured to adjust one period of the basic clock signal by P stages of time lengths, and the second time length is set by setting M bits of N bits of each of P second registers, where each of P, M and N is a positive integer, M is less than or equal to N, and P is configured by a third register.

9. The clock control device according to claim 1, further comprising a second delay module configured to delay the local clock signal by a time length less than or equal to 0.5 periods of the local clock signal, to obtain a second delayed local clock signal as a transmission operating clock for the control device to transmit an internal data signal to the storage device.

10. The clock control device according to claim 9, wherein the second delay module is further configured to delay the internal data signal by 0.5 periods of the internal data signal and output the delayed internal data signal.

11. The clock control device according to claim 9, wherein the clock control device is configured to operate in a double data rate mode, and a frequency of the local clock signal is equal to a frequency of a system clock of the control device.

12. The clock control device according to claim 9, wherein the second delay module comprises one of a clock phase delay module and a delay chain.

13. The clock control device according to claim 9, wherein the first delay module and the second delay module are provided in a microcontroller.

14. A clock control method for a serial peripheral interface, comprising:

receiving a local clock signal and an external clock signal, and delaying the local clock signal to obtain a first delayed local clock signal;

selecting, based on a clock selection control signal, one of the external clock signal and the first delayed local clock signal as a basic clock signal; and phase-delaying the basic clock signal, to obtain a delayed basic clock signal as a reception operating clock for a control device to sample an external data signal transmitted by a storage device.

15. The clock control method according to claim 14, wherein the delaying of the local clock signal to obtain the first delayed local clock signal comprises:

enabling a gate signal upon delaying the local clock signal by an integer multiple of a first unit of time based on a preset input delay value; and gating the local clock signal based on the gate signal to obtain the first delayed local clock signal.

16. The clock control method according to claim 15, wherein the phase-delaying of the basic clock signal to obtain the delayed basic clock signal comprises:

delaying the basic clock signal by a second time length less than or equal to the first unit of time to obtain the delayed basic clock signal.

17. The clock control method according to claim 16, further comprising: before the enabling of the gate signal, performing a first sequence of operations of:

a) adjusting a first input delay value in steps of a second unit of time, and delaying the local clock signal by a delay time length corresponding to the adjusted first input delay value to obtain a third delayed local clock signal;

b) selecting the third delayed local clock signal to sample the external data signal in a read mode; and one of:

c) in response to determining that the external data signal is not successfully sampled in the read mode, recording the delay time length as a first delay value, and one of:

in response to determining that the first delay value is less than the first unit of time, returning to operation a; and in response to determining that the first delay value is not less than the first unit of time, calculating a product of a number of times the first delay value is equal to the first unit of time and the first unit of time to delay the third delayed local clock signal by the product, and returning to operation a; and d) in response to determining that the external data signal is successfully sampled in the read mode, recording the adjusted first input delay value as a first value, iteratively performing operations a~b until determining that the external data signal is not successfully sampled in the read mode, recording, as a second value, the adjusted first input delay value obtained after the iteratively performing of operations a~b, and calculating a first average value of the first value and the second value as the preset input delay value.

18. The clock control method according to claim 17, further comprising: after the calculating of the first average value as the preset input delay value, performing a second sequence of operations of:

e) in a double data rate mode, setting a frequency of the local clock signal to be a frequency of a system clock of the control device;

f) adjusting an output delay value in steps of a third unit of time, and delaying the local clock signal based on a delay time length corresponding to the adjusted output delay value to obtain a fourth delayed local clock signal;

g) selecting the fourth delayed local clock signal to sample the external data signal in the read mode; and one of:

h) in response to determining that the external data signal is not successfully sampled in the read mode, returning to operation f; and i) in response to determining that the external data signal is successfully sampled in the read mode, recording the adjusted output delay value as a third value, iteratively performing operations f~g until determining that the external data signal is not successfully sampled in the read mode, recording, as a fourth value, the adjusted output delay value obtained after the iteratively performing of operations f~g, and calculating a second average value of the third value and the fourth value as a preset output delay value.

19. The clock control method according to claim 18, further comprising: after the calculating of the second average value as the preset output delay value, performing a third sequence of operations of:

j) selecting the external clock signal as the basic clock signal;

k) adjusting the first input delay value in steps of the second unit of time, and delaying the external clock signal based on a delay time length corresponding to the adjusted first input delay value;

l) selecting the delayed external clock signal to sample the external data signal in the read mode; and one of:

m) in response to determining that the external data signal is not successfully sampled in the read mode, returning to operation k; and n) in response to determining that the external data signal is successfully sampled in the read mode, recording the adjusted first input delay value as a fifth value, iteratively performing operations k~l until determining that the external data signal is not successfully sampled in the read mode, recording, as a sixth value, the adjusted first input delay value obtained after the iteratively performing of operations k~l, and calculating a third average value of the fifth value and the sixth value as the preset input delay value.

20. The clock control method according to claim 14, further comprising:

in a double data rate mode and in a case where a frequency of the local clock signal is equal to a frequency of a system clock of the control device, delaying the local clock signal by a time length less than or equal to 0.5 periods of the local clock signal based on a preset output delay value, to obtain a second delayed local clock signal as a transmission operating clock for the control device to transmit an internal data signal to the storage device, and delaying the internal data signal by 0.5 periods of the internal data signal and outputting the delayed internal data signal.

* * * * *